(12) United States Patent
Maniwa et al.

(10) Patent No.: US 8,703,598 B2
(45) Date of Patent: Apr. 22, 2014

(54) MANUFACTURING METHOD OF LEAD FRAME SUBSTRATE

(71) Applicant: Toppan Printing Co., Ltd., Tokyo (JP)

(72) Inventors: Susumu Maniwa, Kasukabe (JP); Takehito Tsukamoto, Tokorozawa (JP); Junko Toda, Kasukabe (JP)

(73) Assignee: Toppan Printing Co., Ltd., Tokyo (JP)

( * ) Notice: Subject to any disclaimer, the term of this patent is extended or adjusted under 35 U.S.C. 154(b) by 0 days.

(21) Appl. No.: 14/038,114

(22) Filed: Sep. 26, 2013

(65) Prior Publication Data

US 2014/0021162 A1 Jan. 23, 2014

Related U.S. Application Data

(62) Division of application No. 12/998,099, filed as application No. PCT/JP2009/004993 on Sep. 29, 2009, now Pat. No. 8,546,940.

(30) Foreign Application Priority Data

Sep. 29, 2008 (JP) ................. 2008-250860

(51) Int. Cl.
*H01L 21/44* (2006.01)
(52) U.S. Cl.
USPC ........... 438/611; 438/123; 438/411; 438/461; 257/E23.056; 257/735
(58) Field of Classification Search
USPC ......... 438/108, 111, 121, 123, 127, 148, 411, 438/461, 611, FOR. 369; 257/E23.056, 257/E23.068, 666, 697, 698, 692, 713, 735, 257/736, 737, 780, 781, 786; 216/11
See application file for complete search history.

(56) References Cited

U.S. PATENT DOCUMENTS 5,656,550 A 8/1997 Tsuji et al. .................... 438/123
5,847,458 A * 12/1998 Nakamura et al. ............ 257/738
(Continued)

FOREIGN PATENT DOCUMENTS

| | | |
|---|---|---|
| CN | 1526167 | 9/2004 |
| JP | 2002-043467 | 2/2002 |

(Continued)

OTHER PUBLICATIONS

Chinese Office Action for corresponding application No. 200980137966.7 issued Jan. 4, 2013.
(Continued)

*Primary Examiner* — Chris Chu

(57) ABSTRACT

A manufacturing method of a lead frame substrate includes: applying a photosensitive resist or a dry film to first and second surfaces of a metal plate; pattern-exposing the photosensitive resist or the dry film, and then developing the first surface and the second surface to form on the first surface a first resist pattern for forming a connection post and to form on the second surface a second resist pattern for forming a wiring pattern; etching the first surface partway down the metal plate to form the connection post; filling the first surface with a pre-molding resin to a thickness with which the etched surface is buried; removing the pre-molding resin uniformly in a thickness direction of the pre-molding resin until a bottom surface of the connection post is exposed; and etching the second surface to form a wiring pattern.

4 Claims, 2 Drawing Sheets

(56) References Cited

U.S. PATENT DOCUMENTS

| | | | | |
|---|---|---|---|---|
| 6,025,640 A * | 2/2000 | Yagi et al. | ............. | 257/666 |
| 6,133,070 A | 10/2000 | Yagi et al. | ............. | 438/121 |
| 6,762,118 B2 * | 7/2004 | Liu et al. | ............. | 438/613 |
| 6,782,610 B1 | 8/2004 | Iijima et al. | ............. | 29/827 |
| 6,949,470 B2 | 9/2005 | Igarashi et al. | ............. | 438/754 |
| 7,049,173 B2 * | 5/2006 | Kim et al. | ............. | 438/107 |
| 7,217,991 B1 * | 5/2007 | Davis | ............. | 257/676 |
| 7,230,328 B2 | 6/2007 | Hazeyama et al. | ............. | 257/685 |
| 7,999,397 B2 | 8/2011 | Haba et al. | ............. | 257/786 |
| 8,110,903 B2 * | 2/2012 | Robinson | ............. | 257/666 |
| 8,193,037 B1 | 6/2012 | Bathan et al. | ............. | 438/111 |
| 2002/0020909 A1 * | 2/2002 | Wakashima et al. | ............. | 257/697 |
| 2002/0094606 A1 * | 7/2002 | Fukutomi et al. | ............. | 438/110 |
| 2004/0106235 A1 | 6/2004 | Igarashi et al. | ............. | 438/127 |
| 2004/0106288 A1 | 6/2004 | Igarashi et al. | ............. | 438/689 |
| 2011/0084370 A1 * | 4/2011 | Su et al. | ............. | 257/669 |

FOREIGN PATENT DOCUMENTS

| | | |
|---|---|---|
| JP | 2002-222894 | 8/2002 |
| JP | 2002-289749 | 10/2002 |
| JP | 2003-309241 | 10/2003 |
| JP | 2004-063742 | 2/2004 |
| JP | 2004-119730 | 4/2004 |
| JP | 2004-281752 | 10/2004 |
| JP | 2006-060153 | 3/2006 |
| JP | 2006-245618 | 9/2006 |
| JP | 2007-324420 | 12/2007 |
| JP | 2009-147117 | 7/2009 |

OTHER PUBLICATIONS

International Search Report for PCT/JP2009/004993, mailed Oct. 27, 2009.
Restriction Requirement mailed from the United Stated Patent and Trademark Office on May 8, 2012 in the related U.S. Appl. No. 12/998,099.
Office Action mailed from the Unites Stated Patent and Trademark Office on Jul. 13, 2012 in the related U.S. Appl. No. 12/998,099.
Office Action mailed from the Unites Stated Patent and Trademark Office on Oct. 22, 2012 in the related U.S. Appl. No. 12/998,099.
Office Action mailed from the United Stated Patent and Trademark Office on Jan. 29, 2013 in the related U.S. Appl. No. 12/998,099.
Notice of Allowance mailed from the United Stated Patent and Trademark Office on Jun. 5, 2013 in the related U.S. Appl. No. 12/998,099.
U.S. Appl. No. 12/998,099, filed Mar. 17, 2011, Susumu Maniwa et al., Toppan Printing Co., Ltd.

* cited by examiner

MANUFACTURING METHOD OF LEAD FRAME SUBSTRATE

CROSS-REFERENCE TO RELATED APPLICATIONS

This application is a U.S. divisional application filed under 37 C.F.R. 1.53(b) claiming priority benefit of U.S. application Ser. No. 12/998,099, filed Mar. 17, 2011, allowed, that application being a continuation application based on and claiming priority benefit of PCT Patent Application No. PCT/JP2009/004993, filed on Sep. 29, 2009, which claims foreign priority benefit on Japanese Patent Application No. 2008-250860, filed on Sep. 29, 2008, the entire contents of each of the foregoing being incorporated herein by reference.

BACKGROUND

1. Field

The present invention relates to a technique about a semiconductor substrate preferable for packaging a semiconductor element, and more particularly to a manufacturing method of a lead frame substrate and to a semiconductor apparatus.

2. Description of the Related Art

A variety of semiconductor elements, such as a memory unit, a CMOS, and a CPU, that are manufactured in the wafer process have terminals for electrical connection. The terminals for electrical connection are different in pitch from the connectors of the printed wiring board to which the semiconductor element is to be attached by a factor of approximately several times to hundreds of times. Therefore, in the case of connecting a semiconductor element to a printed wiring board, an intermediate substrate for converting a pitch (a substrate for packaging a semiconductor element), which is called an interposer, is used.

A semiconductor element is packaged on one surface of the interposer. Connection with a printed wiring board is obtained on the other surface or around the interposer. The interposer has a metal lead frame in its inside or on its surface. The lead frame is used to route electrical connection paths, to thereby expand the pitch of external connection terminals for connection with the printed wiring board.

FIG. 2A to FIG. 2C show a schematic structure of a lead frame substrate of QFN (Quad Flat Non-Lead) type as an example of an interposer As shown in FIG. 2A, on a central portion of a lead frame made of aluminum or copper, there is provided a flat portion 21 on which a semiconductor element 22 is arranged. Around a perimeter of the lead frame, leads 23 with a wide pitch are disposed. The wire bonding method by metal wires 24 such as gold wires is applied to connect between the leads 23 and the terminals for electrical connection of the semiconductor element 22. As shown in FIG. 2B, the constituents are finally molded with a molding resin 25 into integration.

A retaining member 27 in FIG. 2A and FIG. 2B is for retaining the lead frame. The retaining member 27 is removed after molding with the molding resin 25, as shown in FIG. 2C.

With the interposer shown in FIG. 2A to 2C, electrical connection is obtained only between the perimeter of the semiconductor element 22 and the leads 23 around the perimeter portion of the lead frame. Therefore, the interposer is unsuitable for a semiconductor element with a multitude of terminals.

In the case of a small number of terminals, connection between the printed wiring board and the interposer is obtained by metal pins being attached to extraction electrodes 26 around the perimeter portion of the interposer. In the case of a large number of terminals, a BGA (Ball Grid Array) is used in which solder balls are arranged in an array on external connection terminals around the perimeter portion of the interposer.

For a semiconductor element with a small area and a large number of terminals, pitch conversion is difficult with an interposer with only a single wiring layer. To address this, a technique of making the wiring layer into a plurality of wiring layers and stacking them is adopted.

In the case of a semiconductor element with a small area and a large number of terminals, the connection terminals of the semiconductor element are often formed in an array on a bottom surface of the semiconductor element. Therefore, the external connection terminals of the interposer are also arranged in an array. For connection between the interposer and the printed wiring board, a flip chip connection system using microscopic solder balls is adopted. For wiring inside the interposer, holes are bored in the vertical direction from above with a drill or by laser, and the internal surfaces of the holes are subjected to metal plating. Thereby, electrical conduction is obtained between the top and bottom of the interposer.

In the interposers according to the above system, it is possible for the pitch of the external connection terminals to be microsized to approximately 150 to 200 μm. Consequently, the connection terminals can be increased in number. However, reliability and stability of the joint are decreased. Therefore, the interposers are not suitable for application as in-vehicle interposers that require high reliability.

According to the materials and structures that are used, these interposers are divided into several types including one in which the structure for supporting the lead frame portion is made of ceramic and one in which the base material is made from organic matter such as a P-BGA (Plastic Ball Grid Array), a CSP (Chip Size Package), or an LGA (Land Grid Array). An appropriate one is used according to the purpose and the application.

In any of the aforementioned cases, there are advances in finer pitch and readiness to high-speed signals of the connection portions of a interposer with a semiconductor element as the semiconductor element is decreased in size and increased in the number of pins and in speed. In consideration of development in microsizing, the terminal portion is required to have a pitch of 80 to 100 μm.

The lead frame functioning as both of a conductive portion and a supporting member is formed by etching a thin metal. For a stable etching treatment, and handling for the subsequent working, it is desirable that the metal plate have a thickness of approximately 120 μm. Furthermore, to obtain sufficient bonding strength at the time of wire bonding, a metal layer thickness and a land area to some degree are required. In consideration of these two points, least requirement for the thickness of the metal plate is estimated to be approximately 100 to 120 μm. In this case, the leads are made finer, at most, to approximately 120 μm for the pitch and approximately 60 μm for the line width when the metal plate is etched from both sides.

In addition, another problem is that, in the process of manufacturing a lead frame, a retaining member is discarded after the retaining member is used. This leads to an increase in costs.

This will be further described with reference to FIG. 2A to 2C.

A lead frame is attached to a retaining member 27 made of a polyimide tape. On a flat portion 21 of the lead frame, semiconductor elements 22 are fixed with a fixation resin 28 or a fixation tape 28. After that, wire bonding is performed.

Then, the transfer mold method is used to mold the semiconductor elements 22 in a batch with a molding resin 25. Finally, the entire unit is subjected to encapsulation work, and then cut into each semiconductor element 22. The edges of the semiconductor elements 22 are trimmed into completed products. In the case where the rear surface 29 of the lead frame is used as a connection surface with a printed wiring board, the retaining member 27 is indispensable to prevent the molding resin 25 from flowing onto the connection terminal surfaces of the rear surfaces of the leads 23 and attaching there at the time of molding.

However, the retaining member 27 becomes finally unnecessary. Therefore, the retaining member 27 is removed and discarded after molding. This leads to an increase in costs.

For example, Patent Document 1 as an invention in this field has already disclosed an invention that provides a semiconductor apparatus with built-in components by packaging a semiconductor element and a passive element simultaneously on the same lead frame and molding them.

Furthermore, as one solution to solve the aforementioned problem and provide a lead frame substrate that allows formation of traces at a super fine pitch, allows stable wirebonding work, and is excellent in economic efficiency (although not disclosed in Patent Document 1), for example a lead frame substrate with a pre-molding resin as a supporting member of traces can be conceived.

In this solution, for manufacturing a lead frame substrate, a first resist pattern for forming connection posts is formed on a first surface of a metal plate, and a second resist pattern for forming a wiring pattern is formed on a second surface. Copper of the first surface is etched to a desired thickness from above, and then a pre-molding resin is coated on the first surface to form a pre-mold layer. After that, the second surface is etched to form traces. Subsequently, the first and second resist patterns on both surfaces are stripped.

It is assumed that the following merits can be expected from the lead frame substrate manufactured in this manner. That is, even if the thickness of the metal is made thinner to a level that allows fine etching, it is possible to perform stable etching because the pre-molding resin functions as a support member. Moreover, because of small scattering of ultrasonic wave energy, the lead frame substrate is excellent in wire bondability. In addition, the retaining member 27 made of a polyimide tape is not used. Therefore, it is possible to suppress an increase in costs resulting from the use of the retaining member 27.

CITATION LIST

Patent Document 1: Japanese Unexamined Patent Application, First Publication No. 2006-245618

PROBLEMS TO BE SOLVED BY THE INVENTION

However, with the aforementioned solution, there is a concern about problems in manufacturing steps.

That is, in the aforementioned solution, it is technically difficult to coat, with the pre-molding resin, the surface of the metal plate that has been etched partway in the thickness direction. The thickness of the coating is required to be sufficient to provide the lead frame with required rigidity. In addition, the bottom surfaces of the connection posts are required to be completely exposed.

Methods of coating with controlled thickness in this manner include, for example, using a syringe or the like to inject a resin at a single point of a bottom surface to be coated and waiting until the resin spreads over the whole surface to be coated. However, the pre-molding resin has viscosity to some degree. Therefore, it takes time for the pre-molding resin to spread over the whole surface, resulting in a possible problem in terms of productivity.

Furthermore, there is a case where surface tension forms the resin into a ball shape that remains in a small region. In this case, even if the amount of the injected resin is small, the resin becomes thick. As a result, a failure is likely to occur in which the resin reaches the bottom surfaces of the connection posts.

Moreover, other conceivable methods include using a device such as a dispenser to set injection points on the bottom surface to be coated. However, due also to the viscosity of the pre-molding resin, the resin is pulled into a thread during the movement from an injection point to another injection point. As a result, a failure is also likely to occur in which the thread is attached to the bottom surface(s) of the connection post(s).

SUMMARY

The present invention has been achieved in view of the above problems in the prior art, and has an object to provide a manufacturing method of a lead frame substrate and a semiconductor apparatus in which, in the manufacturing process of a lead frame with a pre-mold, a pre-molding resin is allowed to be arranged simply with a suitable thickness.

A first aspect of the present invention is a manufacturing method of a lead frame substrate, including: (i) either coating a photosensitive resist on or attaching a dry film to a first surface and a second surface of a metal plate; (ii) pattern-exposing the photosensitive resist or the dry film on the first surface and the second surface, and then developing the first surface and the second surface to form on the first surface a first resist pattern for forming a connection post and to form on the second surface a second resist pattern for forming a wiring pattern; (iii) etching the first surface of the metal plate partway down the metal plate to form the connection post; (iv) filling the first surface of the metal plate with a pre-molding resin to a thickness with which the etched surface is buried; (v) removing the pre-molding resin uniformly in a thickness direction of the pre-molding resin until a bottom surface of the connection post is exposed; and (vi) etching the second surface of the metal plate to form a wiring pattern.

According to this, the top surface of the pre-molding resin is at the same height as the bottom surface of the connection post. Therefore, it is possible to securely achieve an object of maintaining the rigidity of the lead frame substrate and also of completely exposing the bottom surface of the connection post.

A second aspect of the present invention is the manufacturing method of a lead frame substrate according to the first aspect, in which the pre-molding resin is film-like.

According to this, it is possible to manufacture a desired lead frame substrate more simply than by using a liquid-like resin.

A third aspect of the present invention is the manufacturing method of a lead frame substrate according to either of the first aspect and the second aspect, in which the filling of the pre-molding resin is performed in a vacuum chamber.

According to this, it is possible to reduce the occurrence of bubbles or the like when the pre-molding resin is filled, allowing the manufacture of a more high-quality lead frame substrate.

A fourth aspect of the present invention is a lead frame substrate, including: a metal plate with a first surface and a second surface; a connection post formed on the first surface; wiring formed on the second surface; and a pre-molding resin layer, in which a thickness of the pre-molding resin layer is the same as a height of the connection post.

A fifth aspect of the present invention is a semiconductor apparatus, in which a semiconductor element is packaged on a lead frame substrate, and the lead frame substrate and the semiconductor element are electrically connected to each other by wire bonding, in which the lead frame substrate includes: a metal plate with a first surface and a second surface; a connection post formed on the first surface; wiring formed on the second surface; and a pre-molding resin layer, and in which a thickness of the pre-molding resin layer is the same as a height of the connection post.

According to the present invention, in manufacturing a lead frame substrate with a pre-mold, it is possible to simply make the thickness of a pre-molding resin substantially the same as the height of the connection post.

As a result, the pre-molding resin is provided with the condition of having sufficient rigidity as a support member of the lead frame substrate and also allowing the connection post to be completely exposed. Therefore, a sufficient mechanical strength is offered, and moreover, a joint strength with high reliability in connection is obtained.

DESCRIPTION OF EMBODIMENTS

Hereunder is a description of a lead frame substrate of LGA (Land Grid Array) type as an example to which a manufacturing method of a lead frame substrate according to the present invention is applied, with reference to FIG. 1A to FIG. 1I. FIG. 1A to FIG. 1I show schematic cross-sectional views showing manufacturing steps of a lead frame substrate according to the present invention.

Each unit of the manufactured LGAs had a size of 10 mm square and had an external connection portion with 168 pins arranged in an array when seen in a planar view. A multitude of the LGAs were panelized on a substrate. After the following manufacturing steps, the LGAs were cut out and the edges of the LGAs were trimmed. Thereby, separate LGA-type lead frame substrates were obtained.

Figure 1A:
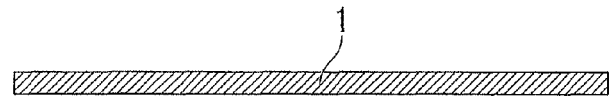
FIG. 1A is a schematic cross-sectional view showing an exemplary manufacturing step of a lead frame substrate according to the present invention.

First, as shown in FIG. 1A, an elongated, band-like copper substrate 1 with a width of 150 mm and a thickness of 150 µm was prepared.

Figure 1B:
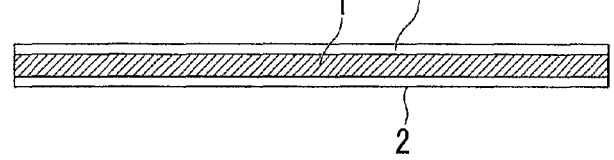
FIG. 1B is a schematic cross-sectional view showing an exemplary manufacturing step of the lead frame substrate according to the present invention.

Next, as shown in FIG. 1B, a photosensitive resist 2 (OFPR4000 manufactured by TOKYO OHKA KOGYO CO., LTD.) was coated on both sides of the copper substrate 1 with a roll coater so as to have a thickness of 5 µm. Then, the copper substrate 1 was pre-baked at 90° C. Instead of the coating of the photosensitive resist 2, a dry film 2 may be attached.

Figure 1C:
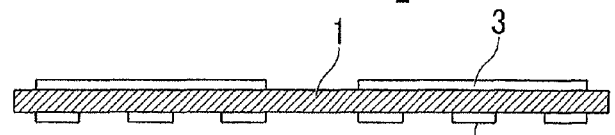
FIG. 1C is a schematic cross-sectional view showing an exemplary manufacturing step of the lead frame substrate according to the present invention.

Next, the copper substrate 1 was pattern-exposed from both sides via a photomask for pattern exposure with a desired pattern. After that, the copper substrate 1 was subjected to a development treatment in a 1% sodium hydroxide solution. Then, the copper substrate 1 was washed with water and post-baked to obtain a resist pattern 3 as shown in FIG. 1C. On one of the surfaces of the copper substrate (a surface opposite to the surface on which the semiconductor element is mounted; hereinafter referred to as a first surface in the present embodiment), a first resist pattern 3 for forming connection posts was formed. On the other of the surfaces (a surface on which the semiconductor element is mounted; hereinafter, referred to as a second surface), a second resist pattern 3 for forming a wiring pattern was formed.

Figure 1D:
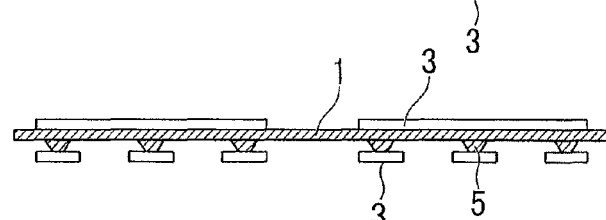
FIG. 1D is a schematic cross-sectional view showing an exemplary manufacturing step of the lead frame substrate according to the present invention.
Figure 1E:
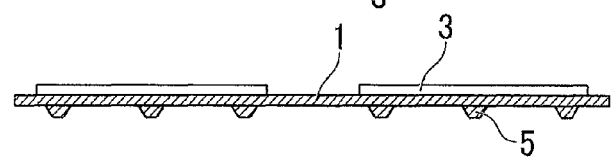
FIG. 1E is a schematic cross-sectional view showing an exemplary manufacturing step of the lead frame substrate according to the present invention.
Figure 1F:
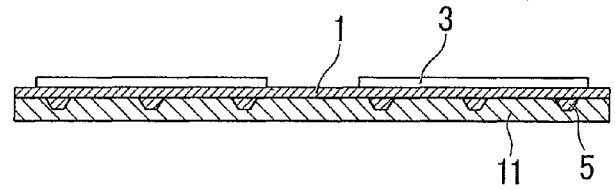
FIG. 1F is a schematic cross-sectional view showing an exemplary manufacturing step of the lead frame substrate according to the present invention.
Figure 1G:
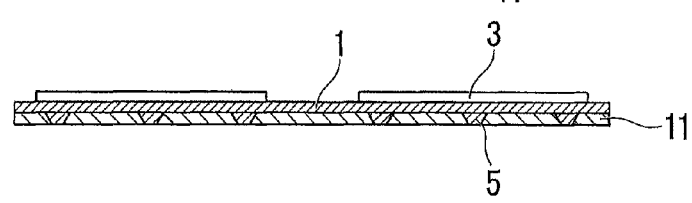
FIG. 1G is a schematic cross-sectional view showing an exemplary manufacturing step of the lead frame substrate according to the present invention.
Figure 1H:
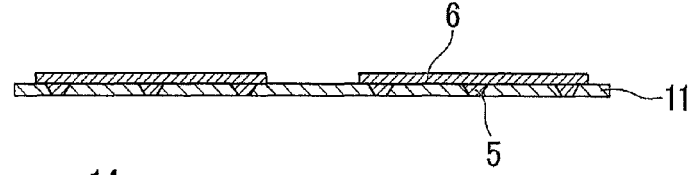
FIG. 1H is a schematic cross-sectional view showing an exemplary manufacturing step of the lead frame substrate according to the present invention.
Figure 1I:
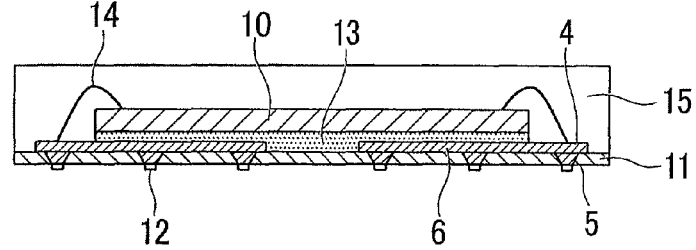
FIG. 1I is a schematic cross-sectional view showing an exemplary manufacturing step of the lead frame substrate according to the present invention.
Figure 2A:
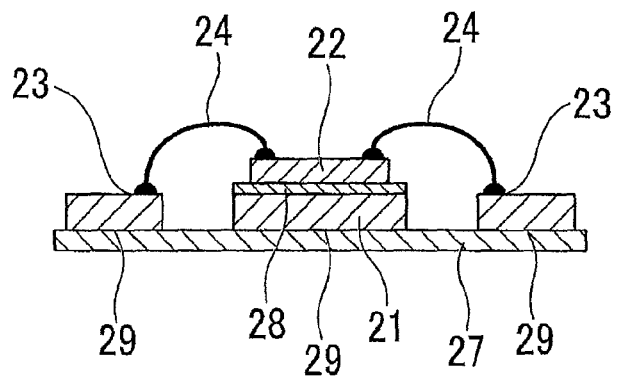
FIG. 2A is a schematic cross-sectional view showing an exemplary conventional lead frame substrate.
Figure 2B:
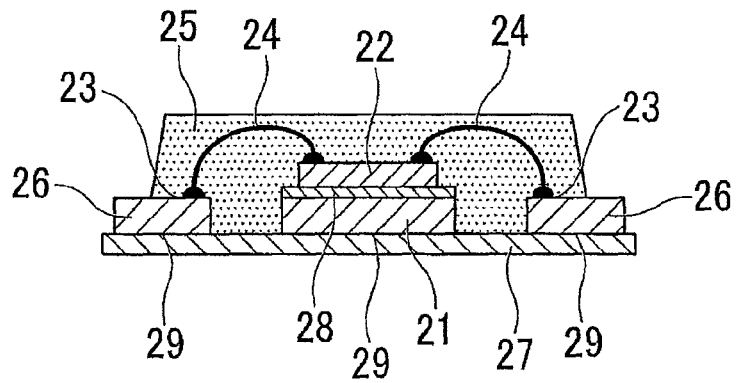
FIG. 2B is a schematic cross-sectional view showing the exemplary conventional lead frame substrate.
Figure 2C:
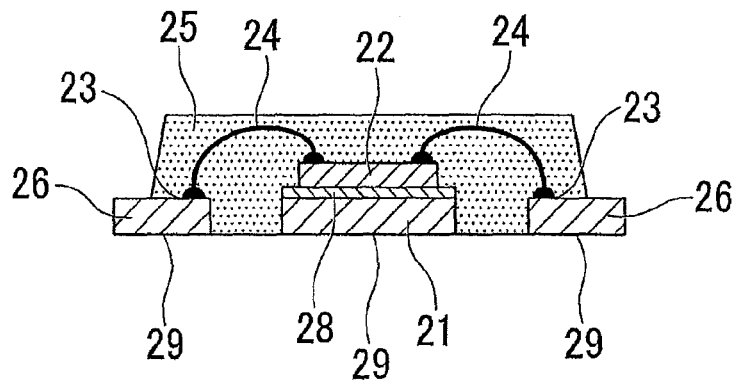
FIG. 2C is a schematic cross-sectional view showing the exemplary conventional lead frame substrate.

As shown in FIG. 1I, a semiconductor element 10 is mounted on top surfaces of the leads at the central portion of the substrate. On the top surfaces of the leads around the perimeter of the semiconductor element 10, wire-bonding lands 4 are formed. On the rear surfaces of the leads, connection posts 5 for guiding an electric signal from upper traces to the rear surface are arranged, for example, in an array when seen in a planar view.

In addition to this, some of the lands 4 around the semiconductor element 10 are required to be electrically connected to the corresponding connection posts 5 located on the lower surface of the semiconductor element. Therefore, a wiring pattern 6 that was connected to some of the lands 4 around the semiconductor element 10 was formed, for example, radially from the perimeter of the substrate toward its center so as to be connected to the connection posts 5 located on the lower surface of the semiconductor element (not shown in the figure).

Next, the second surface of the copper substrate 1 was covered with a back sheet to protect it. Then, an iron chloride solution was used to perform a first etching treatment from the first surface side of the copper substrate 1, to thereby make thin the portions of the copper substrate 1 that were exposed from the first resist pattern 3 on the first surface to 30 µm (FIG. 1D).

The iron chloride solution had a specific gravity of 1.38 and a temperature of 50° C. At the first etching treatment, the portion of the copper substrate 1 on which the first resist pattern 3 for forming the connection posts is formed is not subjected to etching. Therefore, it is possible to form connection posts 5 with a height in the thickness direction of the copper substrate 1 from the etched surface formed in the first etching treatment to the lower surface of the copper substrate 1. The connection posts 5 enable external connection with the printed wiring board.

Note that the first etching treatment does not completely dissolve and remove the portions of the copper substrate 1 that are subjected to etching, but etches the copper substrate 1 partway downward so as to finish the etching treatment when the portions of the copper substrate 1 have a predetermined thickness.

Next, as shown in FIG. 1E, the first surface was stripped of the first resist pattern 3 with a 20% solution of sodium hydroxide in water. The stripper solution had a temperature of 100° C.

Next, as shown in FIG. 1F, a film-like thermoplastic resin (NEX-130 manufactured by Nippon Steel Chemical Co., Ltd.) was used to form a pre-molding resin layer 11 by press work. The film-like thermoplastic resin was adjusted to have a thickness such that the pre-molding resin layer 11 is filled to a position 20 µm higher than the bottom surfaces of the connection posts 5, that is, a thickness of 130 µm.

For the press work, a vacuum-pressurizing-type laminating apparatus was used. The pre-molding resin layer 11 was pressed with a temperature in the pressing portion of 100° C., vacuum in the vacuum chamber of 0.2 torr, and a pressing time of 30 seconds.

like thermoplastic resin as the pre-molding resin layer 11 is effective in simplifying the working.

Furthermore, pressing in the vacuum chamber has the effect of eliminating the voids produced in the pre-molding resin layer 11. Therefore, it is possible to suppress the production of voids in the pre-molding resin layer 11.

After the press work on the pre-molding resin layer 11, heating as post-bake was applied at 180° C. for 60 minutes. At this stage, the first surface was covered with the pre-molding resin layer 11 without discrimination between the etched portions and the unetched portions. The pre-molding resin layer 11 functions as a protective layer. Therefore, the first surface will not be etched at the time of a second etching treatment, which will be described later.

After the post-bake of the pre-molding resin layer 11, the back sheet on the second surface was removed, and etching was performed. As an etching solution, an iron chloride solution was used, which had a specific gravity of 1.32 and a temperature of 50° C. The etching has an object to form a wiring pattern on the second surface. With the etching, the copper on the second surface that was exposed from the second resist pattern 3 was dissolved and removed.

After that, as shown in FIG. 1G, the pre-molding resin layer 11 covering the first surface was polished and removed until the bottom surfaces of the connection posts 5 were exposed. As the polishing apparatus, a buff-roll-type polishing apparatus was used. As for the fiber thickness of the buff roll, a thickness equivalent to No. 800 was used.

Next, as shown in FIG. 1H, the second resist pattern 3 on the second surface was stripped to obtain a desired LGA-type lead frame substrate.

Next, after the stripping of the second resist pattern 3, the metal surfaces on the bottoms of the connection posts 5 that had been exposed by the aforementioned polishing removal were subjected to a surface treatment by the formation method of electroless nickel/palladium/gold plating. Thereby, plated layers 12 were formed. For formation of the plated layers 12, the electrolytic plating method is applicable. However, the electrolytic plating method requires formation of plated electrodes for supplying plating electric current. Due to formation of the plating electrodes, the wiring region becomes smaller by the amount of area used for the formation, making it difficult to route the traces. Therefore, in the present embodiment, the formation method of electroless nickel/palladium/gold plating, which does not require electrode for current supply, was adopted.

That is, the metal surfaces of the connection posts 5 were subjected to an acid degreasing, a soft etching, an acid cleaning, a platinum catalyst activation treatment, a pre-dip, an electroless platinum plating, and an electroless gold plating to form the plated layers 12. The plated layer 12 had a nickel thickness of 3 µm, a platinum thickness of 0.2 µm, and a gold thickness of 0.03 µm. The plating solutions used were: Emplate NI (manufactured by Meltex Inc.) for nickel, PAUROBOND EP (manufactured by Rohm and Haas Company) for platinum, and PAUROBOND IG (manufactured by Rohm and Haas Company) for gold.

Next, on the lead frame, the semiconductor element 10 was attached and mounted with a fixation adhesive 13 or a fixation tape 13. Then, terminals for electrical connection of the semiconductor element 10 and predetermined positions of the wiring pattern (the wire-bonding lands 4) were wire-bonded by use of gold fine wires 14. Then, molding with pre-molding resin 15 was performed so as to coat the lead frames and the semiconductor elements 10 to obtain semiconductor substrates.

Next, the panelized semiconductor substrates were cut to obtain separate semiconductor substrates.

INDUSTRIAL APPLICABILITY

It is possible to simply manufacture a lead frame substrate that has a sufficient mechanical strength and also has high reliability in connection.

DESCRIPTION OF THE REFERENCE NUMERALS AND SYMBOLS

1: copper substrate
2: photosensitive resist or dry film
3: resist pattern
4: wire-bonding land
5: connection post
6: wiring pattern
10: semiconductor element
11: pre-mold layer
12: plated layer
13: fixation adhesive or fixation tape
14: gold fine wire
15: pre-molding resin
21: flat portion of lead frame
22: semiconductor element
23: lead
24: metal wire
25: molding resin
26: extraction electrode
27: retaining member
28: fixation resin or fixation tape
29: rear surface of lead frame

What is claimed is:

1. A manufacturing method of a lead frame substrate, comprising:
   either coating a photosensitive resist on or attaching a dry film to a first surface and a second surface of a metal plate;
   pattern-exposing the photosensitive resist or the dry film on the first surface and the second surface, and then developing the first surface and the second surface to form on the first surface a first resist pattern for forming a connection post and to form on the second surface a second resist pattern for forming a wiring pattern;

etching the first surface of the metal plate partway down the metal plate to form the connection post;

filling the first surface of the metal plate with a pre-molding resin to a thickness with which the etched surface is buried;

removing the pre-molding resin uniformly in a thickness direction of the pre-molding resin until a bottom surface of the connection post is exposed; and etching the second surface of the metal plate to form a wiring pattern.

2. The manufacturing method of a lead frame substrate according to claim 1, wherein the pre-molding resin is film-like.

3. The manufacturing method of a lead frame substrate according to claim 2, wherein the filling of the pre-molding resin is performed in a vacuum chamber.

4. The manufacturing method of a lead frame substrate according to claim 1, wherein the filling of the pre-molding resin is performed in a vacuum chamber.

* * * * *